(12) United States Patent
Storaska et al.

(10) Patent No.: US 7,601,620 B2
(45) Date of Patent: Oct. 13, 2009

(54) METHODS FOR FABRICATING NANOCOILS

(75) Inventors: Garrett A. Storaska, Reston, VA (US); Robert S. Howell, Wheaton, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 111 days.

(21) Appl. No.: 11/524,244

(22) Filed: Sep. 21, 2006

(65) Prior Publication Data

US 2007/0123054 A1 May 31, 2007

Related U.S. Application Data

(60) Provisional application No. 60/719,590, filed on Sep. 23, 2005.

(51) Int. Cl.
*H01L 21/00* (2006.01)
(52) U.S. Cl. .......................... 438/517; 438/479; 216/2; 257/E21.32
(58) Field of Classification Search ................. 257/347, 257/E29.07, E21.32, E27.112, E29.295, E21.703; 365/63
See application file for complete search history.

(56) References Cited

U.S. PATENT DOCUMENTS

| | | | | |
|---|---|---|---|---|
| 3,649,503 | A * | 3/1972 | Terry ...................... | 204/192.35 |
| 6,498,557 | B2 * | 12/2002 | Johnson ....................... | 336/200 |
| 2003/0168707 | A1 * | 9/2003 | Sakamoto et al. ........... | 257/411 |
| 2005/0013151 | A1 * | 1/2005 | Nathanson et al. ............ | 365/63 |

OTHER PUBLICATIONS

International Search Report issued May 15, 2007 in counterpart foreign application in WIPO under application No. PCT/US06/36759.

* cited by examiner

*Primary Examiner*—Sue Purvis
*Assistant Examiner*—Selim Ahmed
(74) *Attorney, Agent, or Firm*—Andrews Kurth LLP (57) ABSTRACT

Improved nanocoils, systems and methods for fabricating nanocoils. Embodiments enable wet etching techniques for releasing coiling arm structures and forming nanocoils. A method for fabricating nanocoils includes providing a silicon-on-insulator (SOI) wafer in which SOI wafer includes a buried oxide layer, patterning one or more devices onto a silicon device layer on top of the buried oxide layer, depositing a tensile stressed layer on the silicon device layer so that stressed layer and silicon device layer form a stressed coiling bi-layer, patterning a coiling arm structure on the stressed coiling bi-layer, depositing a metal encapsulation layer on the stressed coiling bi-layer, and releasing the coiling arm structure so that coiling arm coils to form nanocoil. A system for fabricating nanocoils includes a substrate, a coiling arm structure including, a buried oxide layer deposited on the substrate, a stressed coiling bi-layer attached to the buried oxide layer including a silicon device layer that includes one or more devices defined thereon and a stressed nitride layer that provides a tensile coiling stress, and a metal encapsulation layer that protects stressed nitride layer from hydrofluoric (HF) acid used to release the coiling arm structure from the substrate during the wet etch technique so that coiling arm structure coils into nanocoil when released. Improved nanocoils may be fabricated according to these and other methods and systems.

25 Claims, 13 Drawing Sheets

| DEPOSITION SYSTEM | METHOD OF DEPOSITION | DEPOSITION TEMPERATURE (°C) | 500 Å FILM STRESS (GPa) |
|---|---|---|---|
| P5000 | PECVD | 385 | -0.440 |
| LPCVD | LPCVD | 770 | .0267 |
| CENTURA | CVD | 200 | 0.717 |

FIG. 12 ically coiled, ridged nanocoil.

METHODS FOR FABRICATING NANOCOILS

CROSS-REFERENCE TO RELATED APPLICATIONS

This application claims the priority of U.S. Provisional application No. 60/719,590, entitled "Microscopic Electro-Mechanical Systems, Radio Frequency Devices Utilizing Nanocoils and Spiral Pitch Control Techniques For The Same," filed Sep. 23, 2005, which is hereby incorporated by reference in its entirety. This application is also related to U.S. patent application Ser. No. 11/524,246, entitled "Method For Fabricating Nanocoils," filed herewith on Sep. 21, 2006, now issued as U.S. Pat. No. 7,514,301, and U.S. patent application Ser. No. 11/524,245, entitled "Microscopic Electro-Mechanical Systems, Radio Frequency Devices Utilizing Nanocoils and Spiral Pitch Control Techniques For Fabricating The Same," filed herewith on Sep. 21, 2006, both of which are hereby incorporated by reference in their entirety.

BACKGROUND

Nanocoils are coiled circuits, including memory devices and other circuits. Nanocoils have great potential for superdense memory and power FET applications due to nanocoils' enormous surface storage and periphery area to volume ratio. Previously, a 100× improvement over planar memory has been experimentally realized by using stress ridges to force concentric coiling on polycrystalline silicon (Si) nanocoil. A typical Si nanocoil may be fabricated from silicon nitride/silicon ($Si_3Ni_4$/Si). The silicon nitride $Si_3Ni_4$ is a stressed nitride layer that provides coiling stress cause the formation of the nanocoils when released from an underlying substrate. Such a nanocoil is capable of 100× greater volume density than conventional ICs.

Present nanocoils and nanocoil fabrication methods may be improved. A standard fabrication technique of polycrystalline Si nanocoils involves reactive ion etching (RIE) through coiling layers to expose an oxide release layer and then dipping in hydrofluoric (HF) acid to dissolve the oxide release layer (RIE is a variation of plasma etching in which during etching, semiconductor wafer being etched is placed on a RF powered electrode. The semiconductor wafer takes on potential which accelerates etching species extracted from plasma toward the etched surface. Chemical etching reaction is preferentially taking place in the direction normal to the surface, i.e., etching is more anisotropic than in plasma etching but is less selective). Such a technique is referred to as a "wet" etch technique because of the use of HF acid dip. Attempts to apply this same wet etch technique to single crystalline Si nanocoils with a buried oxide layer (BOX) have been unsatisfactory because a longer HF dip time was required, resulting in the dissolution of at least some of the stressed nitride layer to be dissolved. The dissolution of the stressed nitride layer reduced or eliminated the coiling stress, reducing the amount of coiling. Furthermore, such technique limited the nanocoil yield, typically to narrow sections of the silicon surface. Single crystalline Si nanocoils are needed for certain nanocoil devices. Reliable, efficient nanocoil fabrication methods are needed.

SUMMARY

An advantage of the embodiments described herein is that they overcome the disadvantages of the prior art. These advantages and others are achieved by a method for fabricating nanocoils includes providing a silicon-on-insulator (SOI) wafer in which SOI wafer includes a buried oxide layer, patterning one or more devices onto a silicon device layer on top of the buried oxide layer, depositing a tensile stressed layer on the silicon device layer so that stressed layer and silicon device layer form a stressed coiling bi-layer, patterning a coiling arm structure on the stressed coiling bi-layer, depositing a metal encapsulation layer on the stressed coiling bi-layer, and releasing the coiling arm structure so that coiling arm coils to form nanocoil.

These and other advantages may also be achieved by a system for fabricating nanocoils includes a substrate, a coiling arm structure including, a buried oxide layer deposited on the substrate, a stressed coiling bi-layer attached to the buried oxide layer including a silicon device layer that includes one or more devices defined thereon and a stressed nitride layer that provides a tensile coiling stress, and a metal encapsulation layer that protects stressed nitride layer from hydrofluoric (HF) acid used to release the coiling arm structure from the substrate during the wet etch technique so that coiling arm structure coils into nanocoil when released. Improved nanocoils may be fabricated according to these and other methods and systems.

These and other advantages may also be achieved by a tightly wound, concentrically coiled nanocoil that includes a silicon device layer comprising one or more devices patterned on the silicon device layer, a nitride layer that provide coiling stress for nanocoil, and a metal encapsulation layer located on the nitride layer.

DESCRIPTION OF THE DRAWINGS

The detailed description will refer to the following drawings, wherein like numerals refer to like elements, and wherein.

DETAILED DESCRIPTION

Improved nanocoils and methods and systems for fabricating nanocoils are described herein. Embodiments include methods and systems for fabricating single crystalline silicon nanocoils that overcome the limitations of the wet etch techniques described above. Such embodiments may also be used for poly-si nanocoils. Embodiments include a metal encapsulation layer that protects a stressed nitride layer against long HF acid dip times required for the release of the nanocoils. Further embodiments include a post-deposition thermal heat treatment process which substantially increases intrinsic tensile stress in the stressed nitride layer.

Nanocoils have been previously described in U.S. patent application Ser. No. 10/861,885 ("the '885 application"), filed on Jun. 7, 2004 (published as US 2005/0013151), which is incorporated herein by reference in its entirety. The '885 application describes both nanocoils and methods of fabricating nanocoils. A method of fabricating nanocoils, such as in the '885 application, includes forming a desired circuit/device silicon layer, disposing optional insulator layers above and below the circuit layer, disposing a stressed coiling layer (typically nitride) beneath or above the circuit layer and disposing a buried, sacrificial (e.g., oxide) layer beneath all of the layers, all on a substrate, typically silicon. The sacrificial may be oxide, typical Silicon Oxide, or other sacrificial material. The circuit layer may be memory, control or other circuitry as desired. The layers formed form a coiling arm structure that when released will coil into the nanocoil. The sacrificial layer is selectively removed, typically with a wet hydro-flouric (HF) acid, releasing the layers, including the circuit layer, from the substrate so that the layers coil into a dense, coiled device, the nanocoil. A metallization layer (e.g., gold) may be applied to protect the stressed coiling layer before applying the HF acid.

Figure 1:
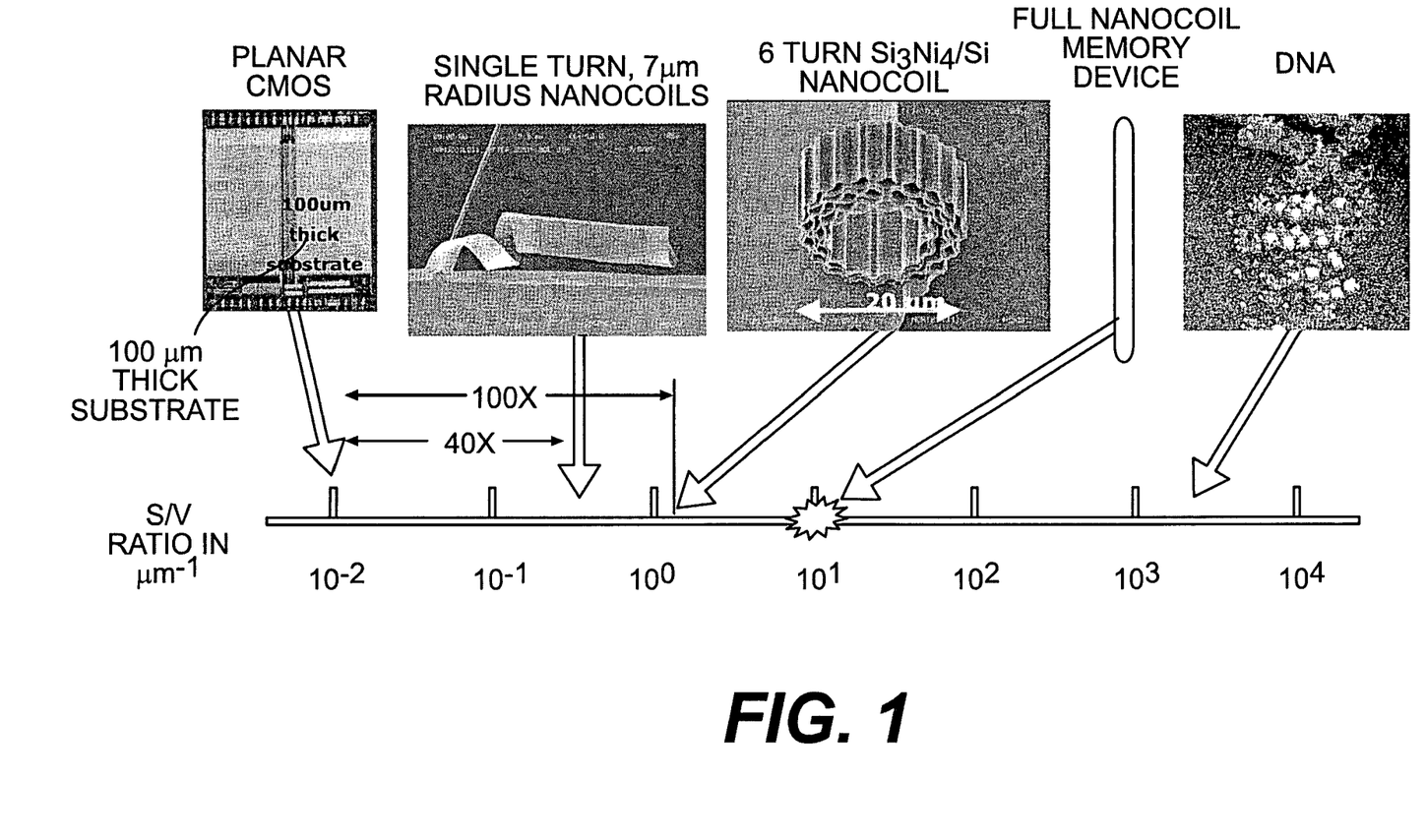
FIG. 1 is a diagram illustrating surface storage area to volume ratios of a variety of technologies.

Due to nanocoils' enormous surface storage area to volume ratio, nanocoils are an ideal platform for ultra dense memory. With reference now to FIG. 1, shown is the surface to volume ratio of a number of technologies from standard planar CMOS memory through DNA. Planar CMOS memory utilizes only the top 1000 Å of the surface for the device active layers, the bulk of the thickness being the substrate which functions as a structural support for the active device. Nanocoil memory relies on first fabricating the memory or other circuit device onto the substrate and then skimming off the top active device layer and coiling it into a tightly packed coil to maximize the storage area to volume density of the device. This technique allows many orders of magnitude improvement over conventional planar memory and added benefit from saving in packaging volume. The full nanocoil memory surface storage area to volume ratio is achievable utilizing embodiments described herein.

Figure 2A:
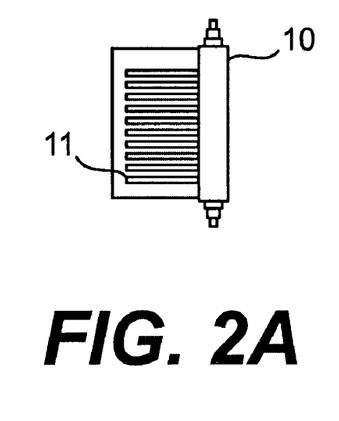
FIGS. 2A-2B are block diagrams illustrating a exemplary nanocoil and an exemplary device layer of the nanocoil.
Figure 2B:
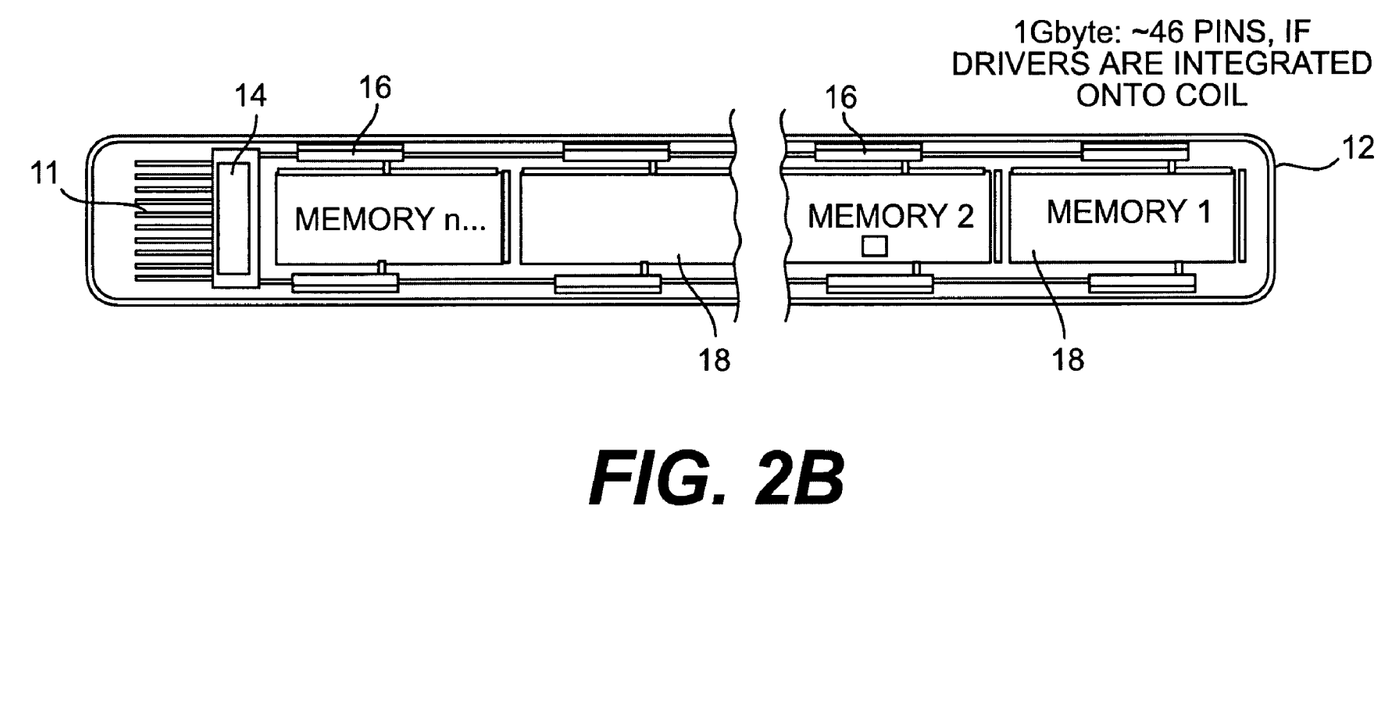

With reference to FIGS. 2A-2B, shown are top views of a memory device nanocoil 10 and a partial view of a component layout on device/circuit layer 12 an uncoiled memory device nanocoil 10. The view depicted shows a partial view of the device layer 12 defined on a coiling arm structure prior to coiling of the nanocoil 10. The nanocoil 10 includes integrated control circuitry 14, integrated memory drivers 16, memory 18 and pins 11 (e.g., on anchor pad). After the coiling arm structure is released or skimmed off, the tightly packed nanocoil 10 packs these components into a ultra-dense, low volume area. The memory device nanocoil 10 is a single crystalline Si CMOS nanocoil. Single crystalline Si provides a higher performance level than poly-crystalline Si and is generally used for circuitry.

Figure 3:
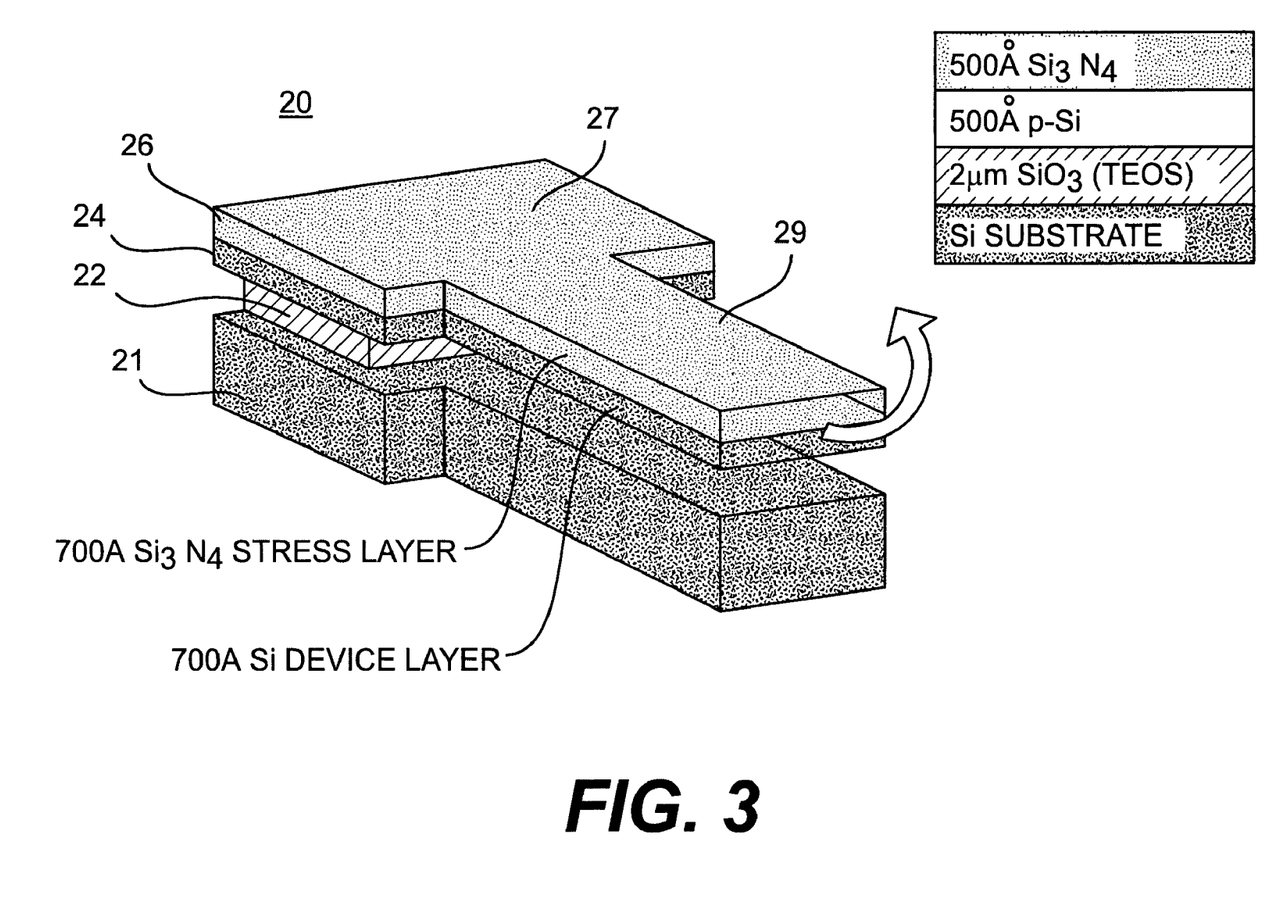
FIG. 3 is a diagram illustrating an exemplary system for fabricating nanocoils.

With reference now to FIG. 3, shown is system 20, a combination of deposited and defined layers, for fabricating poly-crystalline silicon (poly-si) nanocoils. The combination of layers 20 was created using a standard fabrication technique of poly-si nanocoils, which is described herein. The technique includes depositing a thick 2 μm TEOS oxide release layer 22 (TEOS is tetraethyl orthosilicate, $Si(OC_2H_5)_4$, a gaseous compound commonly used in chemical vapor deposition (CVD) of $SiO_2$ processes (resulting deposited $SiO_2$ is called "TEOS Oxide"); TEOS thermally decomposes at around 700° C. to form $SiO_2$, although plasma enhancement lowers temperature of deposition to below 500° C.) on a silicon substrate 21, followed by a coiling layers (actually, a bi-layer) composed of a compressively stressed poly-si device layer 24 (with devices/circuits patterned thereon) and a highly tensile stressed silicon nitride layer (the "stressed nitride layer") 26 (e.g., deposited by low pressure chemical vapor deposition (LPCVD)) of approximately 500 Å each. Deposition order of device layer 24 and stressed nitride layer 26 may be reversed. Patterning/definition of device layer 24 takes place before deposition of stressed nitride layer 26 (unless deposition order reversed). Next, a coiling arm structure with anchor pad 27 and coiling arm 29 (200-1000 μm long and 10 μm wide) is patterned by RIE etching through the coiling bi-layer (device layer 24 and stressed nitride layer 26) to expose the TEOS oxide release layer 22 in field regions between coiling arm structures (typically, many coiling arm structures are patterned on a substrate at a time). Then the layers are dipped in 49% HF acid for approximately one (1) minute to allow the oxide (in TEOS oxide release layer 22) to selectively undercut and dissolve the 10 μm wide coiling arm. After the oxide under the long, narrow coiling arm 29 is dissolved, the released arm 29 coils upward, forming a nanocoil, due to the bi-layer stress state inherent in the coiling bi-layer. Because of the RIE etching and HF acid dipping, this nanocoil fabrication technique is referred to as the "wet etch" technique.

To achieve single crystalline silicon coiling for CMOS memory devices, such as nanocoil 10 shown in FIG. 2, the wet etch technique was applied to an SOI wafer (a SOI wafer is a "silicon-on-insulator" wafer, a silicon wafer with a thin layer of oxide ($SiO_2$) buried in it; devices/circuits are built into a layer of silicon on top of the buried oxide; SOI substrates provide superior isolation between adjacent devices in an integrated circuit as compared to devices/circuits built into bulk wafers). SOI was chosen because it inherently contains an oxide layer and thin single crystalline silicon top layer. In the present example, a buried oxide layer (BOX) of 2000 Å and a top single crystalline silicon layer of 700 Å was utilized. A tensile stressed nitride layer of 700 Å was deposited directly to the top silicon layer and the coiling arm structure was patterned (by RIE etching to expose BOX) and dipped in HF acid. Unfortunately, this technique was unsuccessful because the BOX etch rate in the HF is far slower than that of the deposited TEOS oxide shown in FIG. 3. This necessitated long (e.g., 5 minute) HF acid dip times to release 10 μm wide coiling arms. These longer dip times limit the released coil width to narrow sections of the SOI wafer surface as well as slowly dissolve the stressed nitride layer, thereby eliminating coiling stress.

Figure 4:
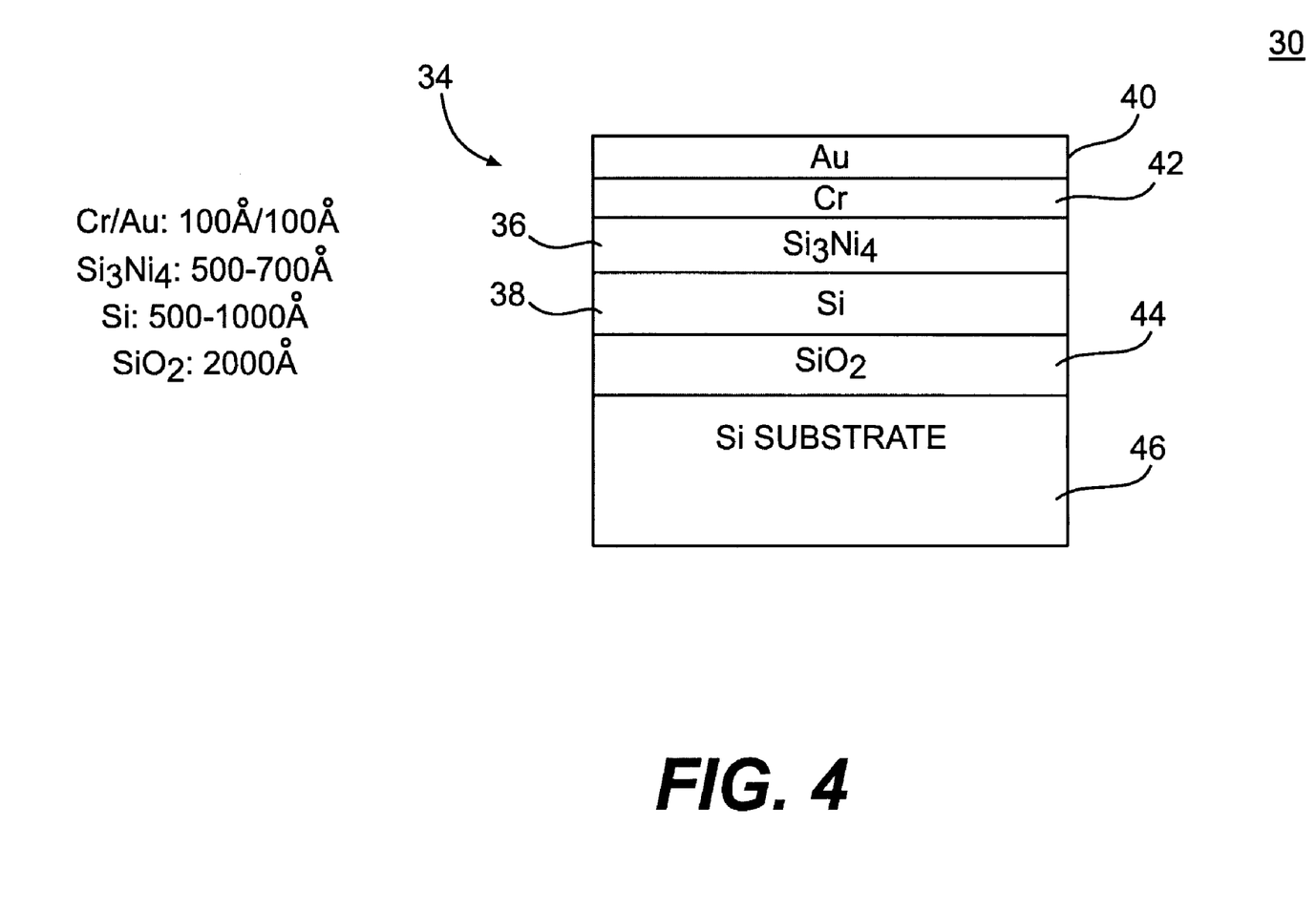
FIG. 4 is a diagram illustrating an exemplary improved system for fabricating nanocoils.

With reference now to FIG. 4, shown is a cross-section of an improved system for fabricating nanocoils. The embodiment shown enables the fabrication of single crystalline silicon nanocoils using the wet etch technique. System comprises nanocoil coiling arm structure 30 including metal encapsulation layer 34 that protects stressed nitride (e.g., $Si_3N_4$) layer 36 (and silicon device layer 38) against the long HF acid dip time required for release of the single crystalline silicon nanocoil coiling arm structure. In the embodiment shown, metal encapsulation layer 34 is a thin sputtered Chromium/Gold (Cr/Au) film or bi-layer including a Au layer 40 on top of a Cr layer 42. In the embodiment shown, the Au layer 40 and Cr layer 42 are of equal thickness (e.g., 100 Å), but one may be made thicker than the other and the layering order may be altered. Metal encapsulation or capping layer 34 is typically substantially thinner than the nitride layer 34, which typically is 500-700 Å, and silicon device layer 38, which typically is 500-1000 Å. Metal capping layer 34 withstands the HF acid dip necessary to dissolve the BOX layer 44 (e.g., 2000 Å of SiO$_2$) in order to release coiling arm structure from substrate 46. Importantly, the thin metal capping layer 34 does not significantly affect or hinder the coiling forces on coiling arm structure. More importantly, thin metal capping layer 34 does protect stressed nitride layer 36, maintaining coiling stress and significantly improving the yield of unbroken nanocoils.

Figure 5:
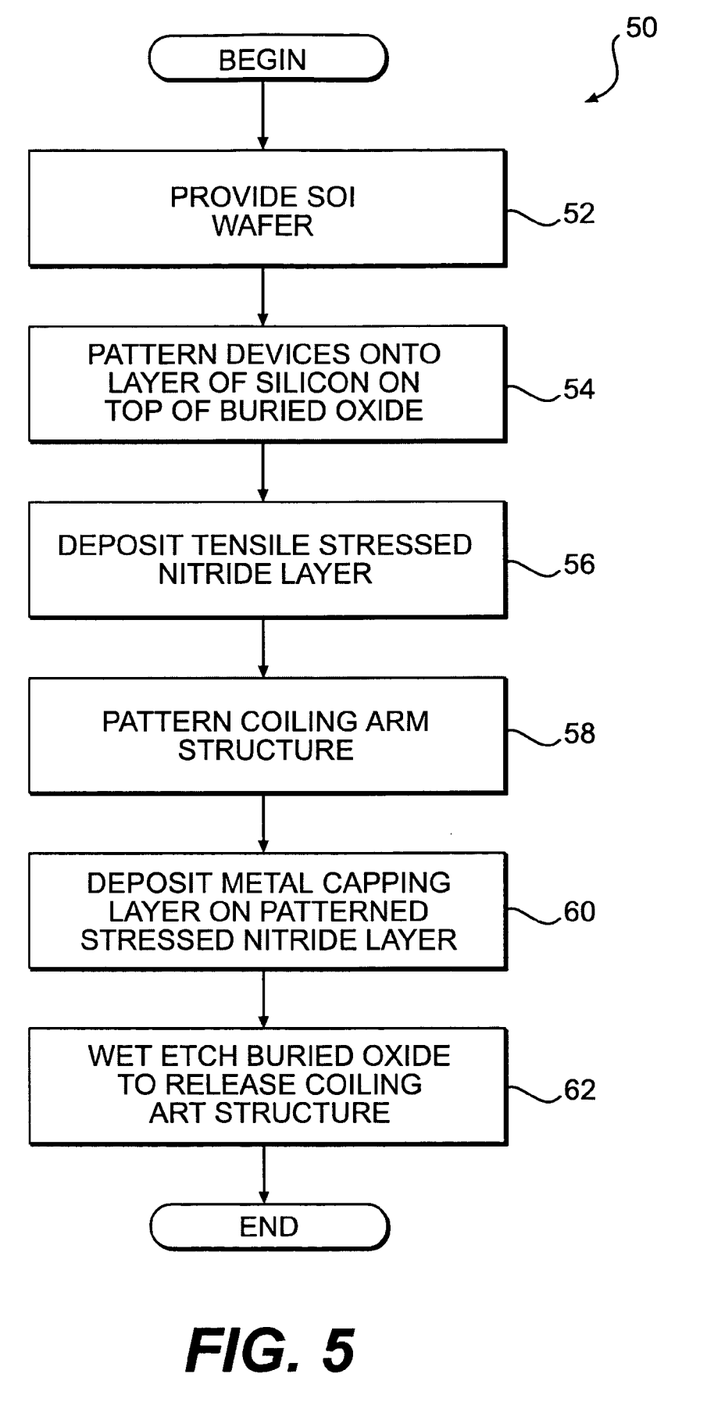
FIG. 5 is a flowchart illustrating an exemplary improved method for fabricating nanocoils.

With reference now to FIG. 5, illustrated is method 50 for fabricating nanocoils. Method 50 for fabricating nanocoils enables the fabrication of single crystalline silicon nanocoils using the wet etch technique. A SOI wafer is provided, block 52. Devices/circuits are patterned onto a layer of silicon on top of the buried oxide using known techniques (e.g., Silicon ASIC fabrication), block 54. The top silicon layer is typically a thin, single crystalline layer. A tensile stressed nitride layer is deposited directly to the top silicon layer, block 56. The coiling arm structure is patterned, block 58, e.g., e.g., by RIE etching or otherwise removing unused portions of top silicon layer, stressed nitride layer and overlaid portions of BOX. Removing unused portions of top silicon layer and stressed nitride layer expose sides of BOX underneath silicon layer. Metal capping layer is deposited on patterned stressed nitride layer, block 60. Metal capping layer may be deposited, e.g., by sputtering on Cr/Au bi-layer. The entire SOI wafer structure is dipped in HF acid (e.g., 49% HF) to dissolve BOX layer and release coiling arm structure to coil away from SOI wafer substrate, block 62. Because of metal encapsulation, the structure may be dipped in HF acid a sufficient length of time (e.g., five (5) minutes) to dissolve BOX layer and wet release coiling arm. The HF acid typically dissolves the oxide starting at the edges of the coiling arm structure and laterally undercutting the coils as the oxide is removed. Once the oxide is dissolved, the device layers are free to coil.

Figure 6:
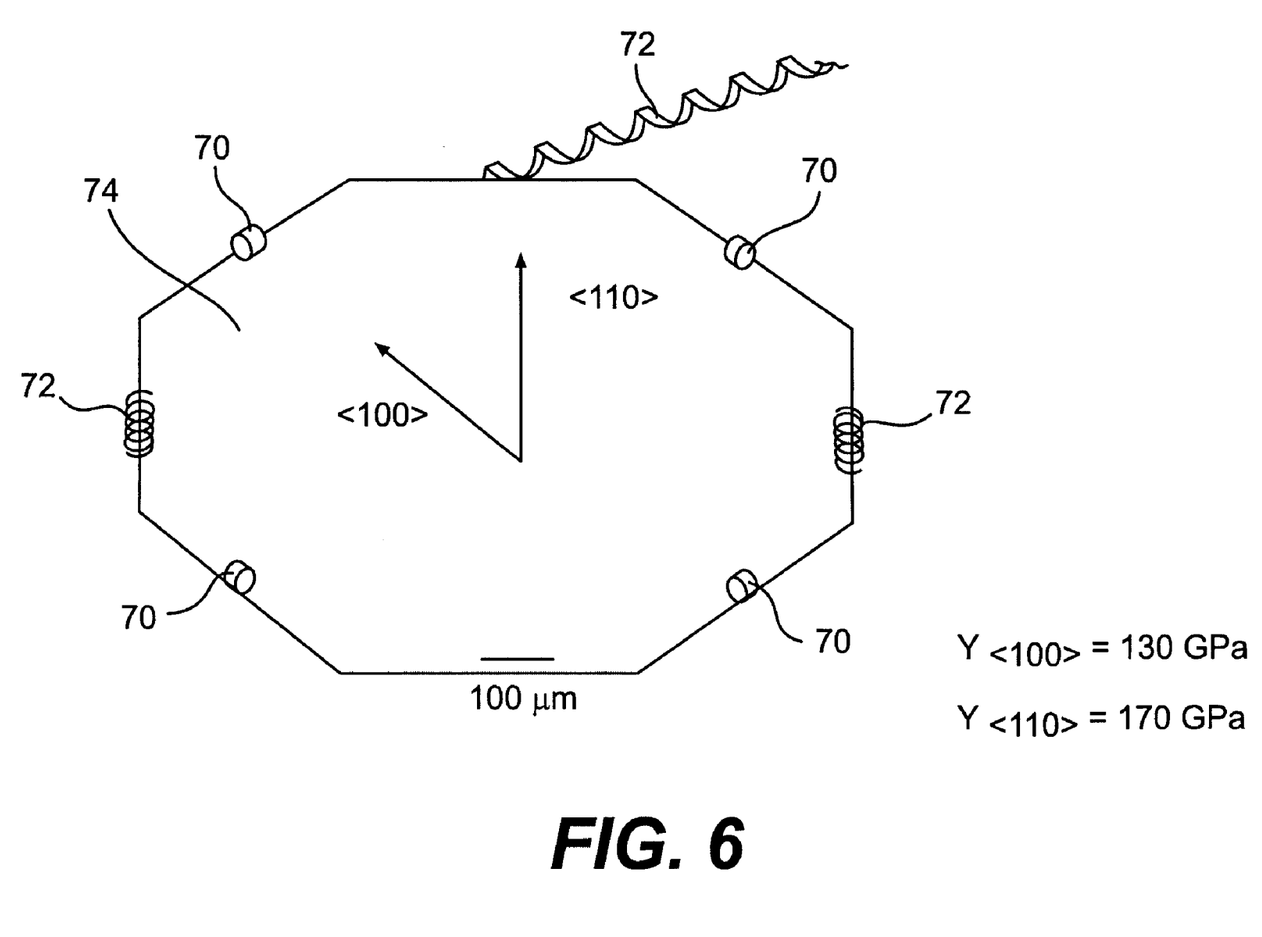
FIG. 6 is an electron microscope view of nanocoils illustrating varying coiling arm structures' orientations that produced the nanocoils.

With reference now to FIG. 6, shown are single crystal silicon nanocoils 70, 72 formed using an embodiment of method for fabricating nanocoils described herein. In the embodiment shown, wet etching (i.e., wet HF acid release (removal of buried oxide layer with HF acid to release nanocoil)) was performed on 10 μm wide nitride/crystalline silicon coiling arms, which contain a silicon substrate, stressed nitride, insulation and metallization layers. After patterning the coiling arm structures, the coiling arm structures were encapsulated with a topside Cr/Au 100 Å/100 Å metallization to protect the stressed nitride from the HF acid. The buried oxide underneath the coiling arm structures was then selectively removed in a HF acid dip, which dissolved the oxide starting at the edges of the coiling arm structure. The dissolving of the oxide layer laterally undercut the coiling arm structures and released the coiling arms as the oxide was removed. Once the oxide was completely dissolved, the device layers (the coiling arms) were free to coil away from SOI substrate 74, forming nanocoils 70, 72.

FIG. 6 illustrates some important characteristics of the crystalline silicon nanocoils 70, 72. For example, the spiraling (or coiling) angles of nanocoils 70, 72 were found to be dependent on the orientation of the coiling arm structure with respect to the underlying crystal: coiling arm structures formed with their primary longitudinal axis in the Y<100> directions (i.e., the crystalline direction of single crystalline silicon substrate 74) self-assembled into tightly packed concentric nanocoil 70, while coiling arm structures formed with their primary longitudinal axis in the Y<110> directions self-assembled in a spiral nanocoil 72 with a uniform pitch (distance between each coil in nanocoil 72) and uniform spiraling/coiling angle (angle of spirals of nanocoil 72 to Y<100> direction).

FIG. 6 shows one Y<100> directional-axis and one Y<110> directional axis. The Y<110> directional axis is forty-five degrees (45°) from the Y<100> directional-axis. The additional Y<100> directions include continuation of the Y<100> directional-axis in the opposite direction (one-hundred eighty degrees (180°) from the Y<100> directional-axis shown). The same concentric nanocoils 70 were also produced on axes ninety degrees (90°) from the Y<100> directional-axis (see FIG. 6). The additional Y<110> directions include the axis one-hundred eighty degrees (180°) from the Y<110> directional axis shown. Likewise, the same spiral nanocoils 72 were produced on axes ninety degrees (90°) from the Y<110> directional-axis (see FIG. 6) on Si substrate 64.

The tendency of the coiling arms to coil (form nanocoils 70) along the Y<100> crystalline directions may be explained by the anisotropy of Young's modulus, which varies from 130 GPa along the Y<100> directions to 170 GPa along the Y<110> directions. In other words, the silicon substrate in the coiling arm structures are stiffer when oriented along the Y<110> directions then when oriented along the Y<100> directions. Indeed, the Y<100> directions, the crystalline orientation of the single crystal silicon substrate 74, are the weakest or least stiff direction of silicon substrate. Consequently, by coiling along the Y<100> directions, the biaxial stress on nanocoils 70, 72 is preferentially acting along the most compliant direction (i.e., in the direction of the underlying crystal orientation). While the nanocoils 70, 72 naturally tend to coil towards the Y<100> directions (the most compliant direction), the increased stiffness in the Y<110> directions prevents from coiling completely in the Y<100> directions. Accordingly, the gradient of stiffness of the coiling arm structure appears to be a key factor in determining the pitch of the resulting nanocoil.

Additionally, as seen in FIG. 6, after releasing coiling arm structures, seven (7) of the eight (8) nanocoils 70, 72 remained intact and attached to the anchor pad 76 (anchor pad 76 is material connected to or that is part of coiling arm structure which does not have buried oxide underneath of it. Consequently, anchor pad 76 remains connected to substrate 74 and does not coil when coiling arm is released). This 85% yield was representative of coiled structures across this wafer and is a 10× improvement over previous release experiments, which did not utilize metal encapsulation layer. The improved yield is attributed to the application of the metal cap, which acts to toughen the released arms against breakage while they are subjected to turbulence in the wet release and rinse steps. In a working nanocoil device, this top metallization can share a dual purpose of protecting the nitride layer as well as interconnecting the active devices areas along the length.

Figure 7:
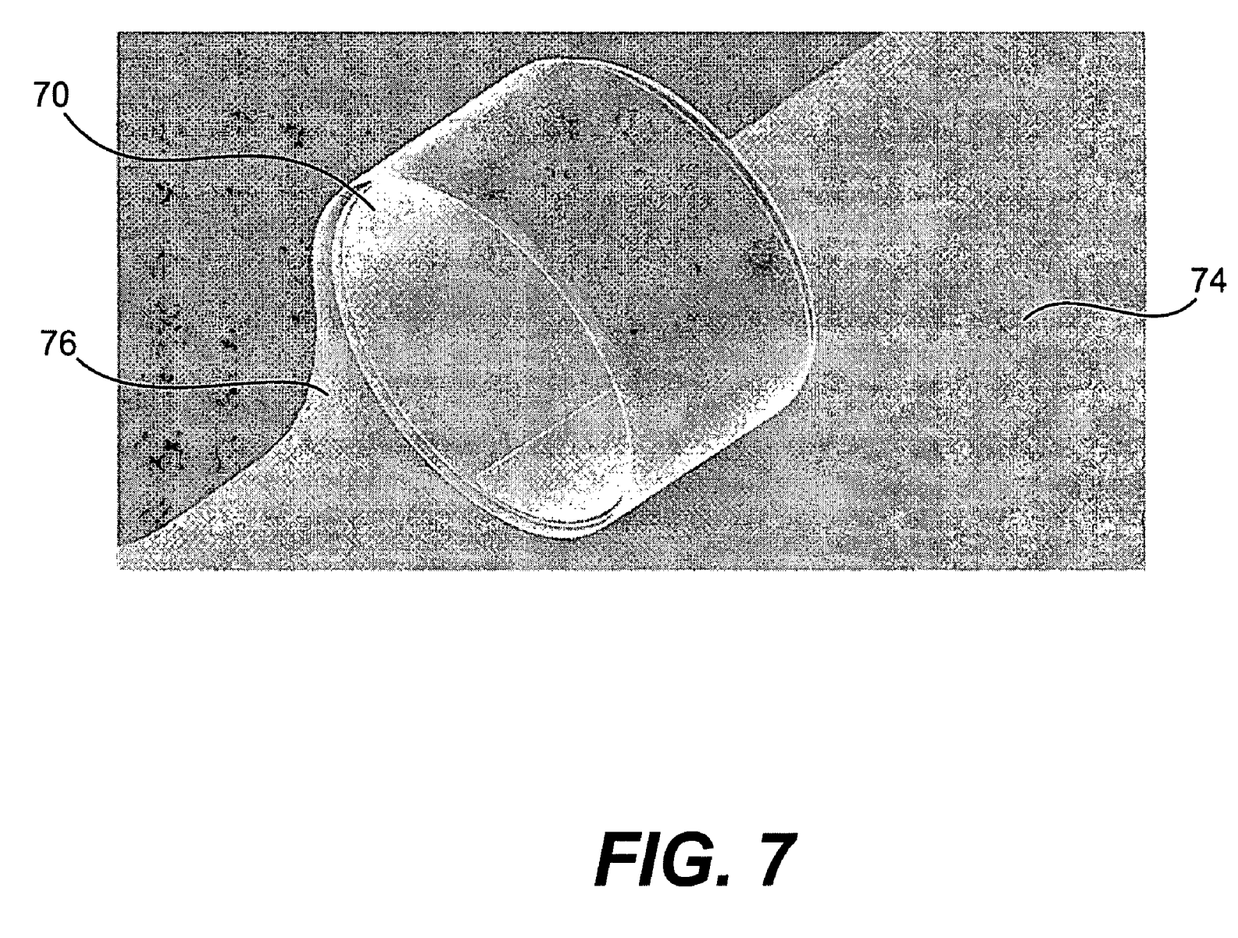
FIG. 7 is an electron microscope view of a concentrically coiled nanocoil.

With reference now to FIG. 7, a magnified view of concentrically coiled nanocoil 72 shows the predictable coiling and tight packing achievable by simply fabricating the coiling arm structures along the Y<100> directions using system 40 and method 50. Concentrically coiled nanocoil devices containing hundreds (100's) of tightly packed layers may be achieved through this process by simply releasing a coiling arm structure with a longer longitudinal arm. Such tightly packed, concentrically coiled nanocoils offer drastically increased surface storage area to volume ratios. This tight reliable coiling shows the promise of this technique to pack high periphery metal oxide semiconductor (MOS) devices into a small device footprint for enabling high current, low capacitance MOS devices. Use of metal encapsulation layer also provides back-to-back shielding between device layers in such a tightly-packed concentrically coiled nanocoil device.

Figure 8A:
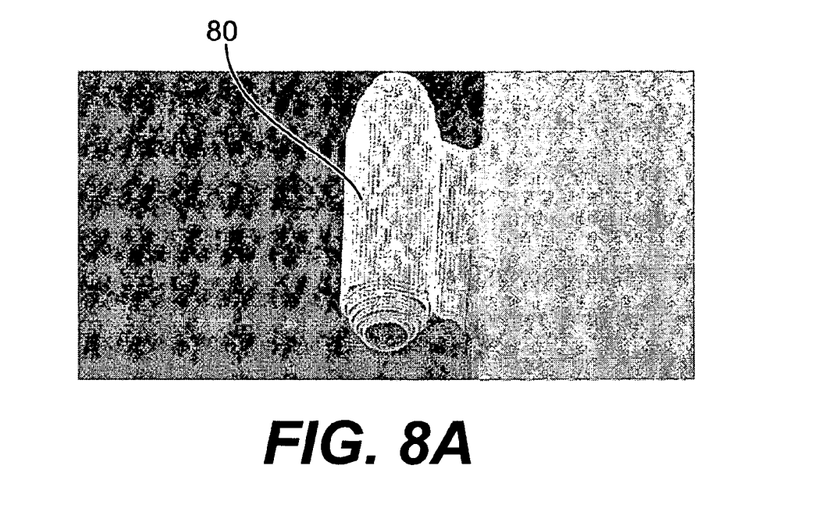
FIGS. 8A-8C are electron microscope views of a concentrically coiled, ridged nanocoil.
Figure 8B:
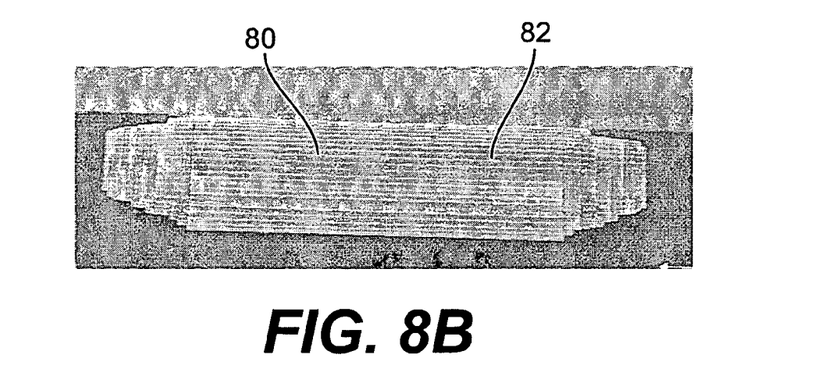
Figure 8C:
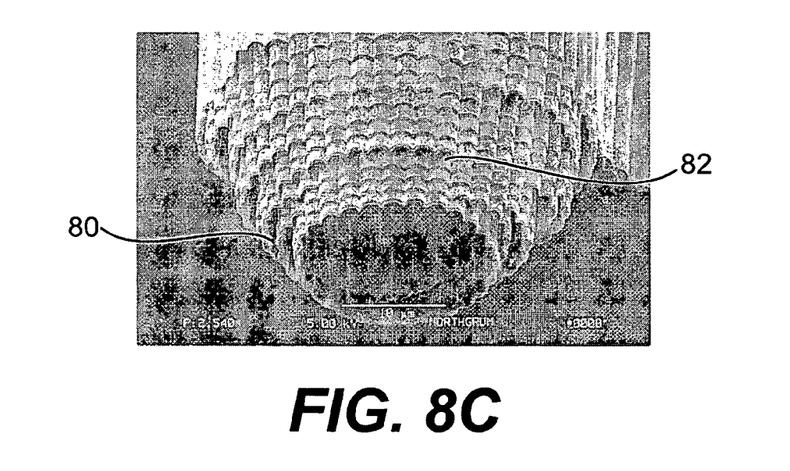

As described previously, the addition of the, e.g., Cr/Au, top metal encapsulation enables long HF acid dip times leading to the release of large area nanocoils. With reference now to FIGS. 8A-8C, shown is metal encapsulated, concentric, ridged nanocoil 80. Ridged nanocoil 80 may be fabricated using an embodiment of the methods of fabricating nanocoils described herein. Ridges may be fabricated, e.g., by putting down a layer of Boron Phosphorus Silicate Glass (BPSG), etching the BPSG into lines, heating the BPSG up, causes the BPSG to re-flow, which forms ridges. Ridged nanocoil 80 is fabricated from poly-si and includes a stressed nitride layer with a Cr/Au top metal encapsulation. Ridges 82 on ridged nanocoil 80 are approximately 2 µm in pitch (spacing between each ridge 82), 1 µm in height and run the width of the ridged nanocoil 80 arm. Ridges 82 were implemented to force uniaxial coiling along the longitudinal coiling arm direction by stiffening the transverse direction to coiling forces. The coiled ridged nanocoil 80 arm is 1000 µm in length and 100 µm wide, representing a total coiled area of 0.1 $mm^2$, a substantially larger area than any known prior nanocoil structure.

With reference to FIG. 8B, the ends of the innermost coils in ridged nanocoil 80 extend beyond the ends of each subsequent coil. This effect was designed into the coiling structure by increasing the width of the coiling arm from the base to the tip so the innermost coil was the widest. With reference to FIG. 8C, shown are a total of 13 concentric coils in ridged nanocoil 80, which were obtained in coiling the 1000 µm length of the coiling arm. During coiling, ridges 82 interlock along certain sections of ridged nanocoil 80. For example, at the 12 o'clock position on ridged nanocoil 80, looking outwards in a radial direction it can be seen that after four (4) interlocking layers, there is a region of misalignment, followed by another four (4) interlocking layers, another misalignment and the final five (5) layers. This effect is due to the 2 µm uniform spacing in ridges 82 which allows adjacent layers with closely aligned ridges 82 to lock into a lower energy state (i.e., with interlocking ridges 82). However, since the circumference of each coil in ridged nanocoil 80 increases radially as it is coiled, the number of ridges 82 per subsequent layer is always changing, forcing sections of misalignment along ridged nanocoil 80. The interlocking nature of ridged nanocoil 80 may be useful, in that with a judicious design of the ridge spacing from base to tip, it is possible to coil a ridged nanocoil device in a predictable and perfectly interlocking manner. Such a ridged nanocoil would greatly facilitate the processing of radially directed metal interconnects between coiling layers, which may ultimately allow shorter current paths and superior thermal conduction away from the ridged nanocoil device.

With reference now to FIGS. 9A-9F, a variable width tip design of a coiling arm structure 90 is schematically illustrated. Specifically, FIGS. 9A-9F each illustrate a sequence of bottom and cross-sectional side views of variable width tip coiling arm structure 90, buried oxide layer (BOX) 92, anchor pad 94, substrate 96, and resulting nanocoil 98 (see FIG. 9F) as coiling arm structure 90 is released from substrate 92 (e.g., by wet etching as described above). In other words, FIGS. 9A-9F show steps of the release process of variable width tip coiling arm structure 90. As shown, coiling arm structure 90 varies in width from its narrowest portion, at connection to anchor pad 94, to its widest portion, at tip 91. Also as shown, coiling arm structure 90 is defined in the Y<100> direction. Consequently, coiling arm structure 90 will concentrically coil when released.

Figure 9A:
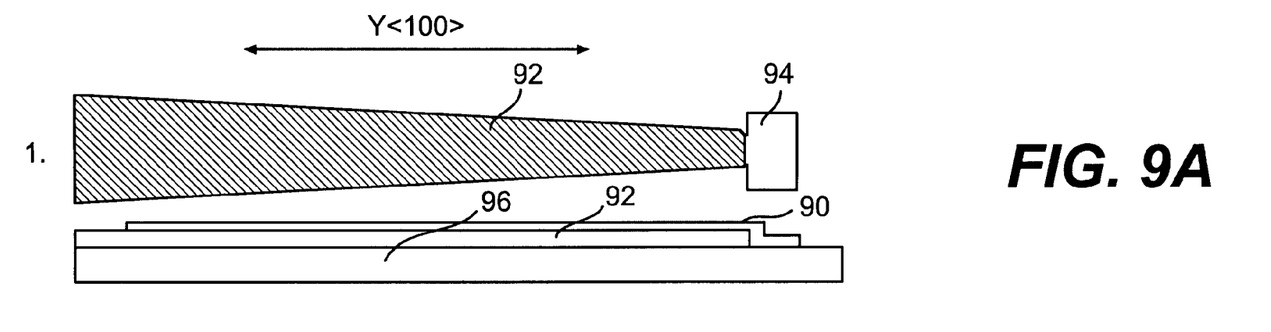
FIGS. 9A-9F are schematic diagrams illustrating a sequence of bottom and cross-sectional side views of an exemplary variable width tip coiling arm structure.
Figure 9B:
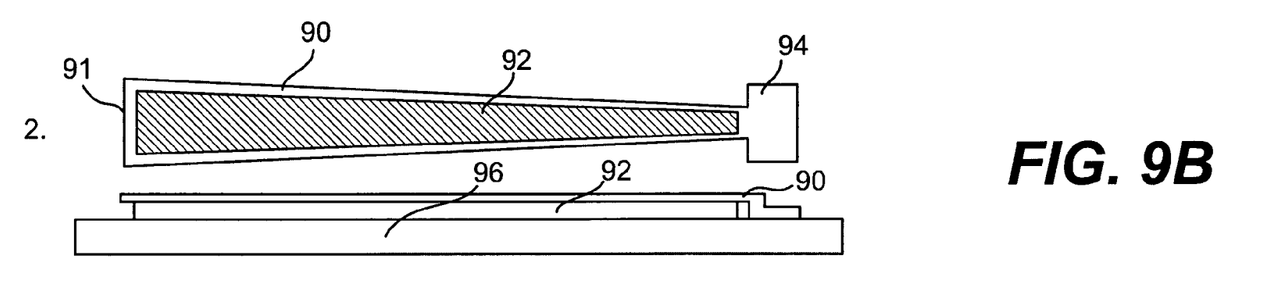
Figure 9C:
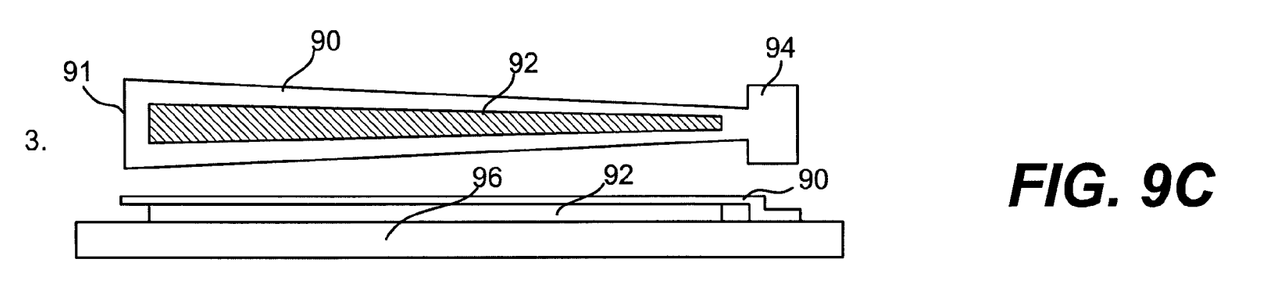
Figure 9D:
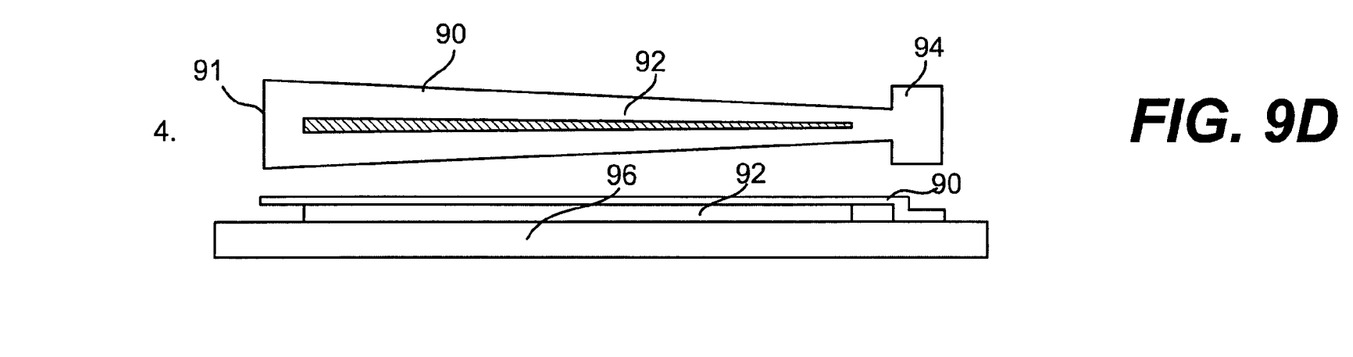
Figure 9E:
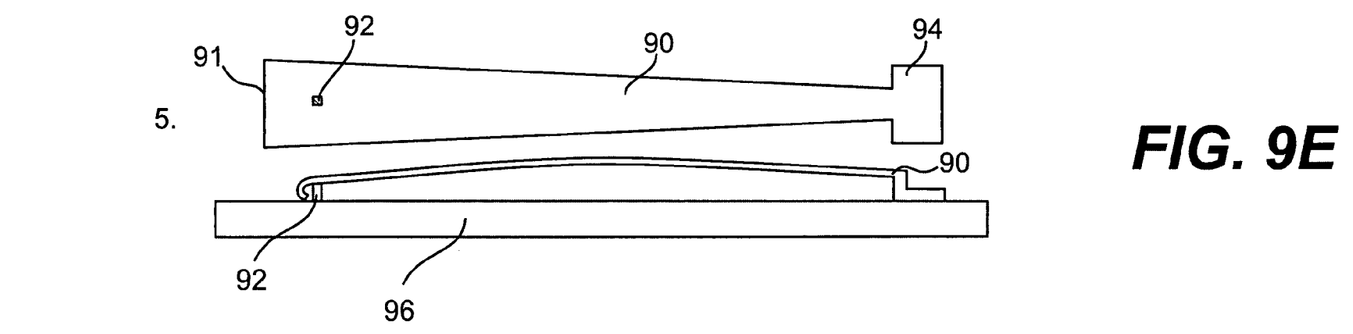
Figure 9F:
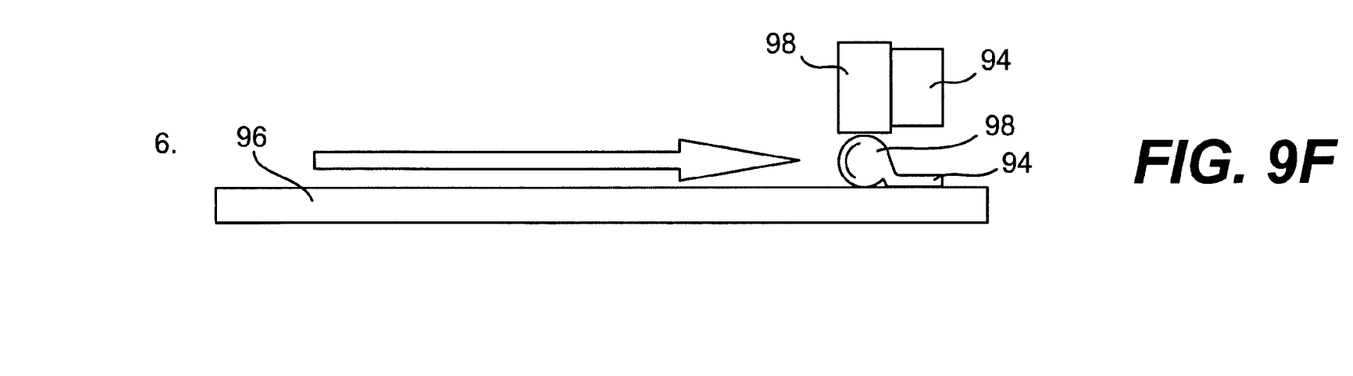

With reference to FIG. 9A, BOX 92 is undissolved. In the embodiment shown, BOX 92 extends beyond coiling arm structure 90. In FIG. 9B, wet etching has begun as entire structure is dipped in, e.g., HF acid dip. Edges of BOX 92 have dissolved, releasing edges of coiling arm structure 90 and exposing edges of coiling arm structure 90 to bottom view as HF acid laterally dissolves exposed sides of BOX 92, undercutting coiling arm structure 90. FIGS. 9C-9E show less and less undissolved BOX 92 as HF acid continues to dissolve BOX 92 from exposed sides underneath coiling arm structure 90.

As shown in FIG. 9E, the net coiling force drives the coiling of coiling arm structure 90 downwards towards substrate 92. Downward coiling may be controlled by reversing the deposition order of the films/layers, e.g., such that the tensile stressed nitride layer is deposited below the poly-si layer, and coiling. A unique feature of the variable width tip coiling arm structure 90 as shown in steps 1-6 (FIGS. 9A-9F) is that during the isotropic wet-etching (a HF wet-etch is isotropic because it will etch oxide in all directions at the same rate) of release oxide (BOX 92) underneath coiling arm structure 90, the last portion of coiling arm structure 90 to be released is the tip 91. Tip 91 is released last because it is the widest section of coiling arm structure 90, and requires a longer time for the HF acid to etch laterally underneath tip 91 from around the edges of tip 91. At step 5 of the release process, see FIG. 9E, the length of coiling arm structure 90 to the right of the remaining oxide 96 is being held from coiling, however the tip of coiling arm structure 90 to the left of oxide 96 can initiate the downward coiling because it is only anchored at one end. At step 6, see FIG. 9F, once the release layer (BOX 96) is completely removed, coiling arm structure 90 is fully released and dynamically coils up (snaps) to anchor pad 94. This process provides a desired means of consistently processing nanocoils with multiple concentric layers because it allows coiling arm structure 90 to initiate the proper coiling direction before coiling arm structure 90 is fully released.

Using a maximally tensile stressed nitride layer is very important for coiling applications that require a tight coiling radius. This is especially true for nanocoils in which multiple or thicker layers must be coiled, for example, nanocoils with metalization (metal encapsulation layer) and passivation layers required for the fabrication of a true memory device. These multiple layers can add stiffness to the coiling arm structure, which may reduce the coiling radius.

Figure 10:
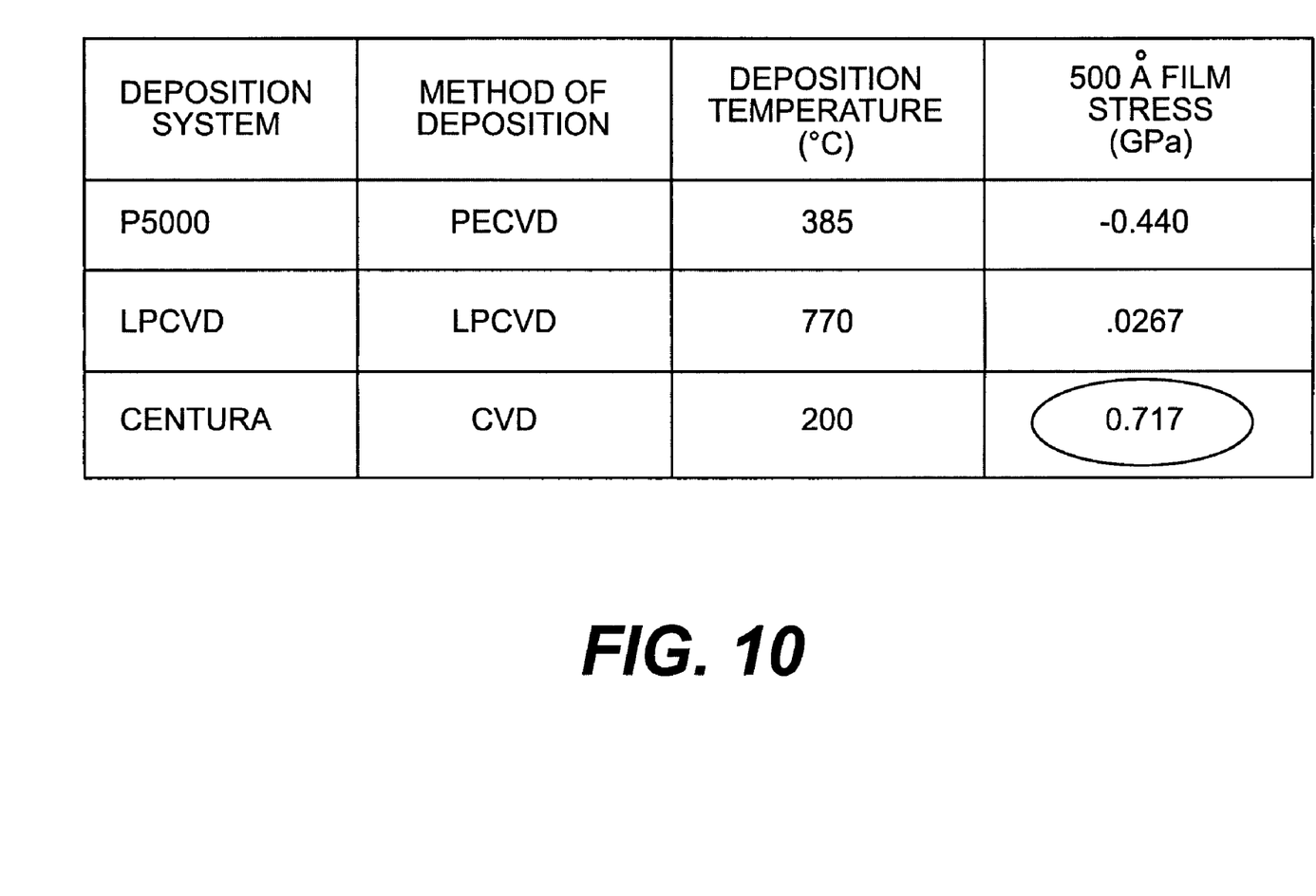
FIG. 10 is a table illustrating three (3) common nitride deposition techniques or system.

With reference now to FIG. 10, shown is a table illustrating three (3) common nitride deposition techniques or systems (P5000™—a plasma enhanced chemical vapor deposition (PECVD) technique, a low-pressure CVD (LPCVD) technique, and Centura™, a CVD technique), their respective deposition temperatures and the residual tensile stress (in GPa) of a 500 Å stressed nitride ($Si_3Ni_4$) layer or film deposited using the deposition technique. Of the three, only the LPCVD and Centura nitrides provide significant tensile stress. Generally, the more stoichiometric the layer/film, the higher the tensile stress. Stoichiometric stressed nitride layer/film composition may be verified using refractive index measurements. For example, a stoichiometric nitride ($Si_3Ni_4$) has a refractive index of n~1.98. Si-rich nitride, $Si_3Ni_x$, x<4, has a refractive index of 1.98<n<3.85. Stressed nitride layers with a refractive index of 1.95<n<1.97 are stoichiometric or slightly N-rich and are preferred.

Figure 11:
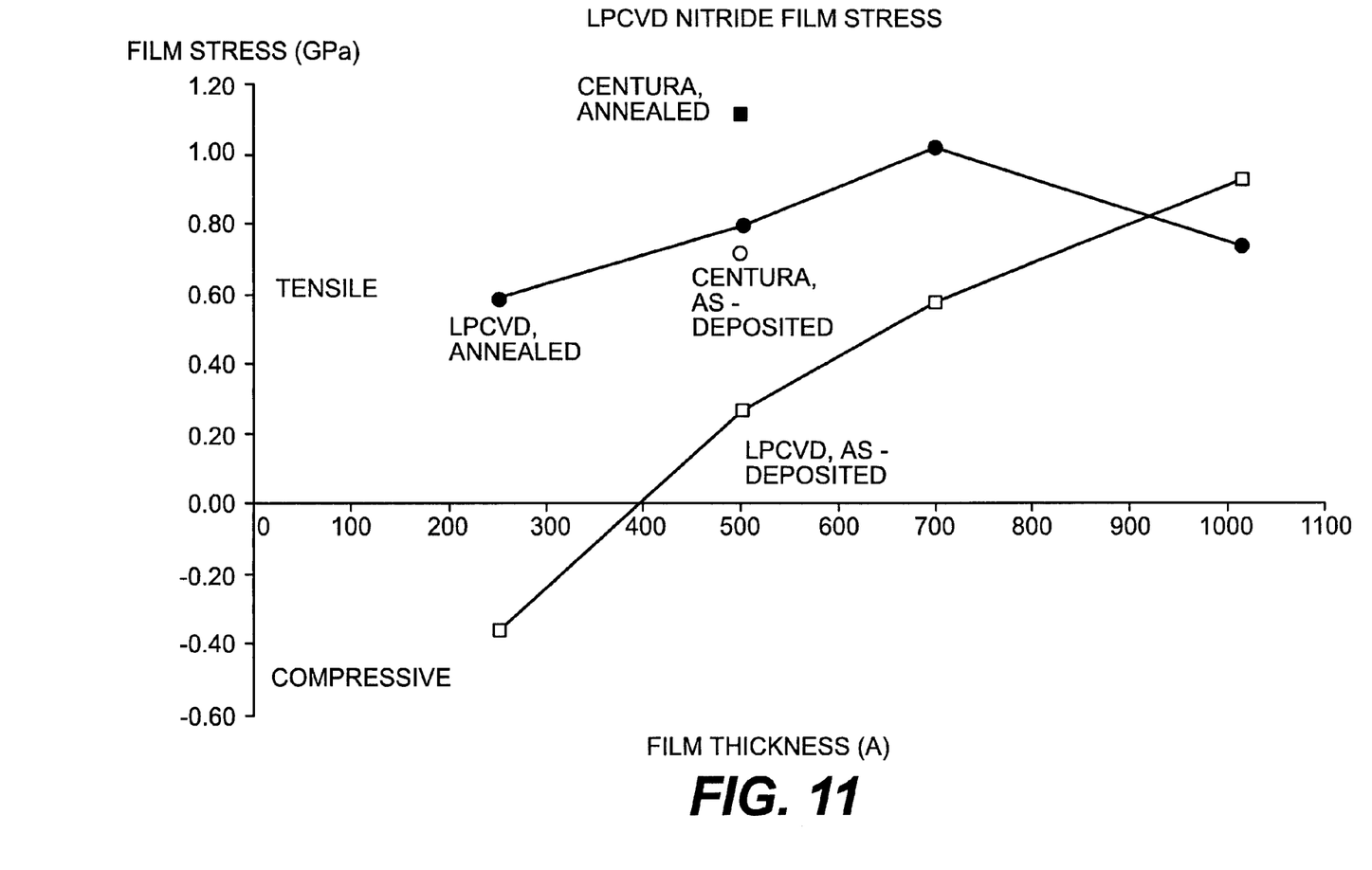
FIG. 11 is a graph illustrating tensile stress level benefits due to a post-deposition annealing process.

An additional technique for improving tensile stress of the stressed nitride layer is post-deposition annealing. With reference now to FIG. 11, shown is a chart that describes the results of a post-deposition thermal anneal process which was applied to stressed nitride layers to increase the inherent tensile stress in the layers. The post-deposition thermal anneal process uses a forty-five minute, 1000° C. heat treatment in a $N_2$ ambient atmosphere to prevent oxidation of the nitride. Results shown in FIG. 11 indicate a substantial increase in the intrinsic tensile stress levels in both LPCVD and Centrura™ deposited nitrides. Utilizing the post-deposition annealing may be necessary to ensure optimal stress levels exist in the stressed nitride layer for small radius coiling.

Figure 12:
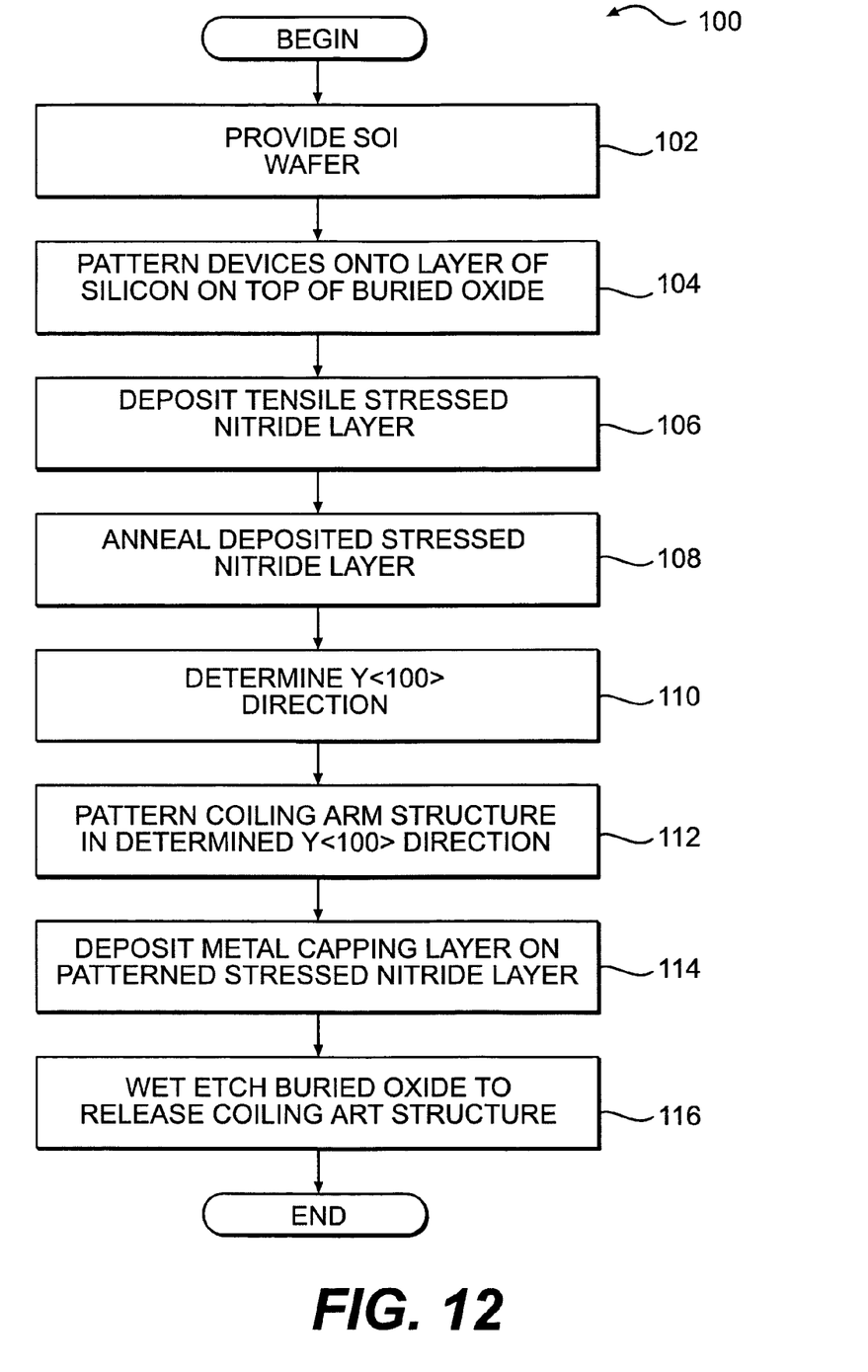
FIG. 12 is a flowchart illustrating an exemplary improved method for fabricating nanocoils.

With reference now to FIG. 12, illustrated is method 100 for fabricating concentrically coiled nanocoils. Method 100 for fabricating nanocoils enables the fabrication of tightly and concentrically coiled silicon nanocoils. A SOI wafer is provided, block 102. Devices/circuits are patterned onto a layer of silicon on top of the buried oxide using known techniques, block 104. The top silicon layer is typically a thin, single crystalline layer although a poly-si may be used. A tensile stressed nitride layer is deposited directly to the top silicon layer, block 106. Preferably, a LPCVD or reliable, high tensile stress producing CVD system, such as Centrura™, is used to deposit the nitride layer. Deposited stressed nitride layer is annealed, block 108. For example, deposited nitride layer may be thermally annealed in a forty-five minute, 1000° C. heat treatment in a $N_2$ ambient atmosphere to prevent oxidation of the nitride. A Y<100> direction, i.e., crystalline direction, is determined, block 110. The coiling arm structure is patterned in the determined Y<100> direction, block 112, e.g., by RIE etching or otherwise removing unused portions of top silicon layer, stressed nitride layer and overlaid portions of BOX. Removing unused portions of top silicon layer and stressed nitride layer expose sides of BOX underneath silicon layer. Patterning the coiling arm structure may also include patterning a coiling arm structure with an increasing width to the coiling arm tip, as shown in FIG. 9A above.

Metal capping layer is deposited on patterned stressed nitride layer, block 114. Metal capping layer may be deposited, e.g., by sputtering on Cr/Au bi-layer. The entire SOI wafer structure is dipped in HF acid (e.g., 49% HF) to dissolve BOX layer and release coiling arm structure to coil away from SOI wafer substrate, block 116. Because of metal encapsulation, the structure may be dipped in HF acid a sufficient length of time (e.g., five (5) minutes) to dissolve BOX layer and wet release coiling arm. The HF acid typically dissolves the oxide starting at the edges of the coiling arm structure and laterally undercutting the coils as the oxide is removed. Once the oxide is dissolved, the device layers are free to coil towards the substrate, as discussed above.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for fabricating nanocoils, comprising:
providing a silicon-on-insulator (SOI) wafer, in which SOI wafer includes a buried oxide layer;
patterning one or more devices onto a silicon device layer on top of the buried oxide layer;
depositing a tensile stressed layer on the silicon device layer so that stressed layer and silicon device layer form a stressed coiling bi-layer;
patterning a coiling arm structure on the stressed coiling bi-layer, wherein patterning the coiling arm structure comprises selectively removing portions of the stressed coiling bi-layer so as to define the coiling arm structure pattern and to expose the buried oxide layer;
depositing a metal encapsulation layer on the stressed coiling bi-layer after patterning the coiling arm structure; and
releasing the coiling arm structure so that coiling arm coils to form nanocoil, wherein the releasing submerges the SOI wafer in acid to release the coiling arm structure and the deposited metal encapsulation layer protects the stressed coiling bi-layer from the acid used during the releasing without significantly hindering the coiling of the coiling arm structure.

2. The method of claim 1 in which depositing a metal encapsulation layer includes sputtering on a chromium/gold (Cr/Au) bi-layer.

3. The method of claim 2 in which the Cr is sputtered on top of the Au.

4. The method of claim 1 in which releasing coiling arm structure comprises wet etching the buried oxide layer, whereby the buried oxide layer is dissolved.

5. The method of claim 4 in which the wet etching comprises dipping the SOI wafer with the various attached layers into hydrofluoric (HF) acid.

6. The method of claim 1 in which patterning the coiling arm structure comprises RIE etching and exposing the buried oxide layer.

7. The method of claim 1 in which patterning one or more devices patterns a memory device onto the silicon device layer.

8. The method of claim 1 in which depositing a tensile stressed layer deposits a stressed nitride layer.

9. The method of claim 8 in which depositing the stressed nitride layer comprises chemical vapor deposition (CVD) of the stressed nitride layer.

10. The method of claim 8 in which depositing the stressed nitride layer comprises low-pressure CVD (LPCVD) of the stressed nitride layer.

11. The method of claim 1 further comprising annealing the deposited tensile stressed layer.

12. The method of claim 11 in which the annealing comprises, thermally annealing the deposited stressed layer for forty-five minutes at 1000° C. in a $N_2$ ambient atmosphere.

13. The method of claim 1 further comprising determining a crystalline direction.

14. The method of claim 13 in which patterning the coiling arm structure comprises patterning the coiling arm structure in the determined crystalline direction, so that the releasing the coiling arm structure forms a concentrically coiled nanocoil.

15. The method of claim 1 in which the silicon device layer comprises a single crystalline silicon.

16. The method of claim 1 in which patterning the coiling arm structure comprises patterning the coiling arm structure with an increasing width to the coiling arm structure tip.

17. The method of claim 1 in which the nanocoil is formed with a plurality of ridges.

18. The method of claim 1 in which the silicon device layer comprises a poly-crystalline silicon.

19. The method of claim 1 in which the deposited metal encapsulation layer that is 200 Å thick.

20. The method of claim 2 in which the deposited metal encapsulation layer that is 200 Å thick.

21. The method of claim 2 in which the depositing sputters on a Cr/Au bi-layer that includes 100 Å thick Cr and 100 Å thick layers.

22. A method for fabricating nanocoils, comprising:
providing a silicon-on-insulator (SOI) wafer, in which SOI wafer includes a buried oxide layer;
patterning one or more devices onto a silicon device layer on top of the buried oxide layer;
depositing a tensile stressed layer on the silicon device layer so that stressed layer and silicon device layer form a stressed coiling bi-layer;
patterning a coiling arm structure on the stressed coiling bi-layer, wherein patterning the coiling arm structure comprises selectively removing portions of the stressed coiling bi-layer so as to define the coiling arm structure pattern and to expose the buried oxide layer;
depositing a chromium/gold (Cr/Au) encapsulation bi-layer on the stressed coiling bi-layer after patterning the coiling arm structure; and
releasing the coiling arm structure so that coiling arm coils to form nanocoil in which the releasing submerges the SOI wafer in acid to release the coiling arm structure and the deposited Cr/Au encapsulation layer protects the stressed coiling bi-layer from the acid used during the releasing without significantly hindering the coiling of the coiling arm structure.

23. The method of claim 22 in which the deposited Cr/Au encapsulation layer that is 200 Å thick.

24. The method of claim 23 in which the deposited Cr/Au encapsulation layer that includes 200 Å thick Cr and 200 Å thick layers.

25. A method for fabricating nanocoils, comprising:
providing a silicon-on-insulator (SOI) wafer, in which S0I wafer includes a buried oxide layer;
patterning one or more devices onto a silicon device layer on top of the buried oxide layer;
depositing a tensile stressed layer on the silicon device layer so that stressed layer and silicon device layer form a stressed coiling bi-layer;
patterning a coiling arm structure on the stressed coiling bi-layer, wherein patterning the coiling arm structure comprises selectively removing portions of the stressed coiling bi-layer so as to define the coiling arm structure pattern and to expose the buried oxide layer;
depositing a metal encapsulation layer on the stressed coiling bi-layer after patterning the coiling arm structure; and
releasing the coiling arm structure so that coiling arm coils to form nanocoil, wherein the deposited metal encapsulation layer protects the stressed coiling bi-layer from deposited being substantially damaged during the releasing without significantly hindering the coiling of the coiling arm structure.

* * * * *